United States Patent
Ono et al.

(10) Patent No.: US 7,208,768 B2
(45) Date of Patent: Apr. 24, 2007

(54) ELECTROLUMINESCENT DEVICE

(75) Inventors: Yoshi Ono, Camas, WA (US); Wei Gao, Vancouver, WA (US); John F. Conley, Jr., Camas, WA (US); Osamu Nishio, Nara (JP); Keizo Sakiyama, Nara Pref. (JP)

(73) Assignee: Sharp Laboratories of America, Inc., Camas, WA (US)

( * ) Notice: Subject to any disclaimer, the term of this patent is extended or adjusted under 35 U.S.C. 154(b) by 195 days.

(21) Appl. No.: 10/836,669

(22) Filed: Apr. 30, 2004

(65) Prior Publication Data

US 2005/0253136 A1 Nov. 17, 2005

(51) Int. Cl.
 *H01L 27/15* (2006.01)
(52) U.S. Cl. .................. 257/79; 438/22; 257/E33.001; 977/950
(58) Field of Classification Search .................. 257/79; 438/22
 See application file for complete search history.

(56) References Cited

U.S. PATENT DOCUMENTS

| | | | | |
|---|---|---|---|---|
| 3,821,774 | A | * | 6/1974 | Beale ........................... 257/13 |
| 5,179,316 | A | * | 1/1993 | Kellam ........................ 313/499 |
| 5,432,366 | A | * | 7/1995 | Banerjee et al. ............ 257/327 |
| 5,920,086 | A | * | 7/1999 | MacFarlane et al. ........ 257/103 |
| 2003/0205710 | A1 | * | 11/2003 | Gardner et al. ............... 257/79 |
| 2004/0036115 | A1 | * | 2/2004 | Disney ........................ 257/342 |
| 2005/0073246 | A1 | * | 4/2005 | Hoffman ...................... 313/503 |
| 2005/0247924 | A1 | * | 11/2005 | Atwater et al. ................ 257/13 |

OTHER PUBLICATIONS

Sze, S, Physics of Semiconductor Devices, 1981, John Wiley & Sons, Second edition, p. 99.*

Kwok Ng, Complete Guide to Semiconductor Devices, 2002, John Wiley & Sons, Inc., 2nd, Chapter 46.*

Wang et al. "Green ZnO Phosphor by Oxidation of Metallic Zinc in Air" Abstract from Twelfth International Symposium on the Physics and Chemistry of Luminescent Materials,Monday, Apr. 28, 2003, Paris France.*

"Analysis of electroluminescence spectra of silicon junctions in avalanche breakdown using an indirect interband recombination model" Lahbabi et al. Applied Physics Letters, vol. 77, 20, Nov. 13, 2000, p. 3182.

"Analysis of electroluminescence spectra of silicon and gallium arsenide p-n junctions in avalanche breakdown", Lahbabi et al., Journal of Applied Physics, Vo. 95,4, Feb. 15, 2004, p. 1822.

* cited by examiner

*Primary Examiner*—B. William Baumeister
*Assistant Examiner*—Matthew L. Reames
(74) *Attorney, Agent, or Firm*—Law Office of Gerald Maliszewski; Gerald Maliszewski

(57) ABSTRACT

A method is provided for forming an electroluminescent device. The method comprises: providing a type IV semiconductor material substrate; forming a p+/n+ junction in the substrate, typically a plurality of interleaved p+/n+ junctions are formed; and, forming an electroluminescent layer overlying the p+/n+ junction(s) in the substrate. The type IV semiconductor material substrate can be Si, C, Ge, SiGe, or SiC. For example, the substrate can be Si on insulator (SOI), bulk Si, Si on glass, or Si on plastic. The electroluminescent layer can be a material such as nanocrystalline Si, nanocrystalline Ge, fluorescent polymers, or type II–VI materials such as ZnO, ZnS, ZnSe, CdSe, and CdS. In some aspect, the method further comprises forming an insulator film interposed between the substrate and the electroluminescent layer. In another aspect, the method comprises forming a conductive electrode overlying the electroluminescent layer.

54 Claims, 12 Drawing Sheets

OPERATION HIGHLIGHTING THE AVALANCHE
MODE OF REVERSE BIASED OPERATIONS

AVALANCHE MULTIPLICATION OF ELECTRONS
AND HOLES VIEWED ENERGETICALLY

AVALANCHE MULTIPLICATION OF ELECTRONS
AND HOLES VIEWED SPATIALLY

BAND DIAGRAM OF THE INTERFACE BETWEEN
SILICON AND ZnO FOR n+ AND p+ Si

BAND DIAGRAM OF THE DEVICE UNDER REVERSE BIAS
ALLOWS INJECTION OF ELECTRONS AND HOLES INTO THE ZnO

Fig. 16   PLAN VIEW   CROSS-SECTION
Fig. 17   PLAN VIEW   CROSS-SECTION
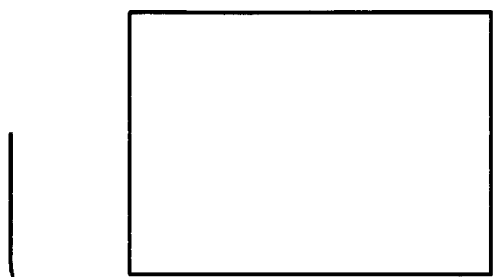 
Fig. 18   PLAN VIEW   CROSS-SECTION
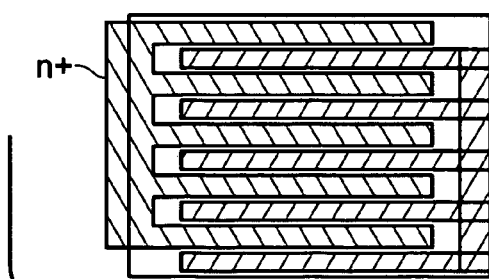 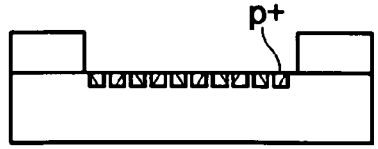

Fig. 19 PLAN VIEW 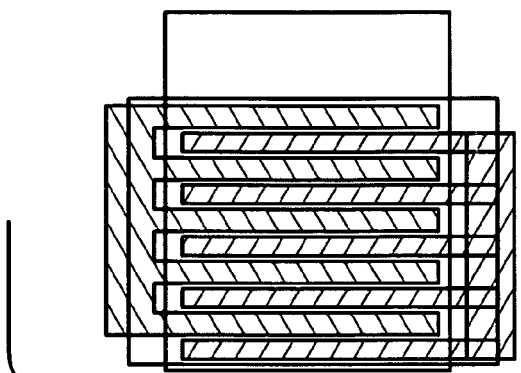  CROSS-SECTION 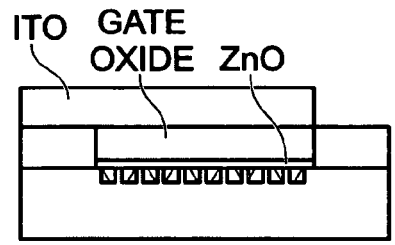
Fig. 20 PLAN VIEW 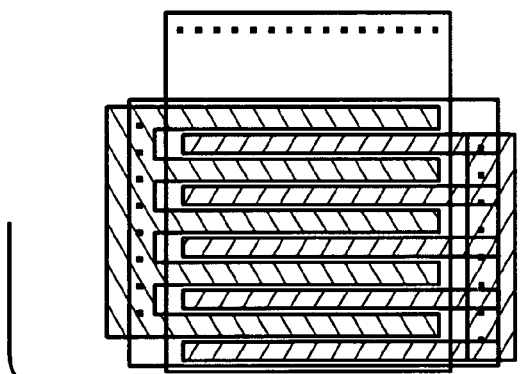  CROSS-SECTION 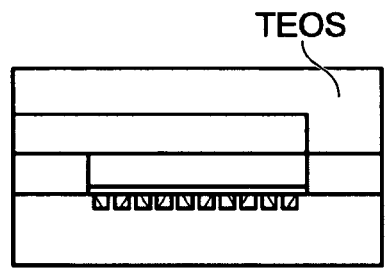
Fig. 21 PLAN VIEW 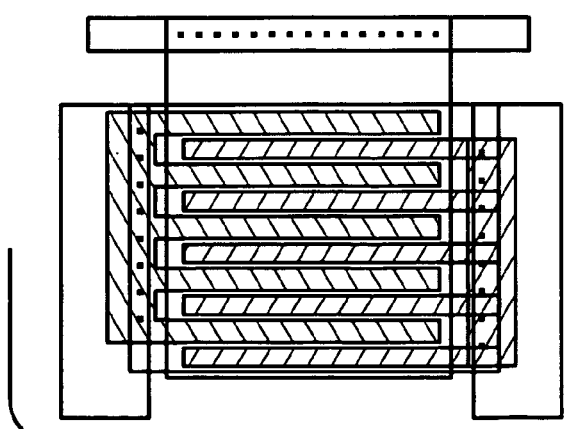  CROSS-SECTION 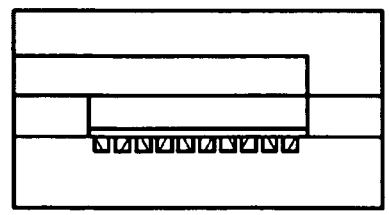

ELECTROLUMINESCENT DEVICE

BACKGROUND OF THE INVENTION

1. Field of the Invention

This invention generally relates to integrated circuit (IC) fabrication and, more particularly, to a direct current (dc), type IV substrate electroluminescent device and corresponding fabrication processes.

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals, at room temperature. However, these devices are fabricated on materials that are typically not compatible with silicon, for example type III–V materials such as InGaN, AlGaAs, GaAsP, GaN, and GaP. An EL device built on one of these substrates can efficiently emit light in a narrow bandwidth within the visible region, depending on the specific material used. Additionally, type II–VI materials such as ZnSe have been used. Other type II–VI materials such as ZnS and ZnO are known to exhibit electroluminescence under ac bias conditions. These devices can be deposited onto silicon for use in light generating devices if special (non-conventional) CMOS processes are performed. Other classes of light emitting devices are organic light emitting diodes (OLEDs), nanocrystalline silicon (nc-Si), and polymer LEDs.

A simple and efficient light-emitting device compatible with silicon, and powered by a dc voltage would be desirable in applications where photonic devices (light emitting and light detecting) are necessary. Efficient silicon substrate EL devices would enable a faster and more reliable means of signal coupling, as compared with conventional metallization processes. Further, for intra-chip connections on large system-on-chip type of devices, the routing of signals by optical means is also desirable. For inter-chip communications, waveguides or direct optical coupling between separate silicon pieces would enable packaging without electrical contacts between chips. For miniature displays, a method to generate small point sources of visible light would enable simple, inexpensive displays to be formed.

Therefore, it would be advantageous if a simple EL device could be fabricated on a Si substrate.

It would be advantageous if a Si substrate EL device could be operated with a small, dc voltage.

It would be advantageous if a Si substrate EL device could emit shorter wavelengths of light, in the blue and near-ultraviolet regions of the spectrum.

SUMMARY OF THE INVENTION

The present invention is able to generate light, from a sub-micron to many micron-sized devices, on a silicon wafer. Advantageously, the emitted light has a wavelength between 350 nanometers (nm) and 700 nm, which is near the UV and visible regions of the spectrum, and predominantly in the wavelength between 370 and 390 nm. As the EL device is formed on a Si substrate, it can be fabricated using many of the conventional CMOS circuit process steps. Further, the EL device is activated with a dc voltage, rather than with a high frequency or alternating current (ac) potential. Thus, the EL device fabrication can be integrated into a CMOS flow, without the introduction of incompatible materials such as Ga or As. The light is generated at the junction of a pn junction, for fast operation and fast rise and fall times.

Accordingly, a method is provided for forming an electroluminescent device. The method comprises: providing a type IV semiconductor material substrate; forming a p+/n+ junction in the substrate; and, forming an electroluminescent layer overlying the p+/n+ junction(s) in the substrate. A plurality of p+/n+ junctions can be interleaved to generate larger intensities of light.

Providing a type IV semiconductor material substrate includes providing the substrate from a material such as Si, C, Ge, SiGe, or SiC. For example, the substrate can be Si on insulator (SOI), bulk Si, Si on glass, or Si on plastic. Forming an electroluminescent layer overlying the substrate includes forming an electroluminescent layer from a material such as nanocrystalline Si, nanocrystalline Ge, fluorescent polymers, or type II–VI materials such as ZnO, ZnS, ZnSe, CdSe, and CdS.

In some aspect, the method further comprises forming an insulator film interposed between the substrate and the electroluminescent layer. In another aspect, the method comprises forming a conductive electrode overlying the electroluminescent layer. The electrode may be used to modulate the control voltage and, thus, the emitted light.

In some aspects, forming a plurality of interleaved p+/n+ junctions includes forming gaps between the n+ and p+ regions having a width in the range of 0 to 2 microns. In other aspects, the gap is 0.4 to 0.5 microns.

Additional details of the above-described EL device fabrication method, a corresponding EL device structure, and an EL operating method are provided below.

BRIEF DESCRIPTION OF THE DRAWINGS

FIGS. 16 through 21 are plan and partial cross-sectional views of steps in the completion of an exemplary ZnO electroluminescent device.

DETAILED DESCRIPTION OF THE PREFERRED EMBODIMENTS

Figure 3:
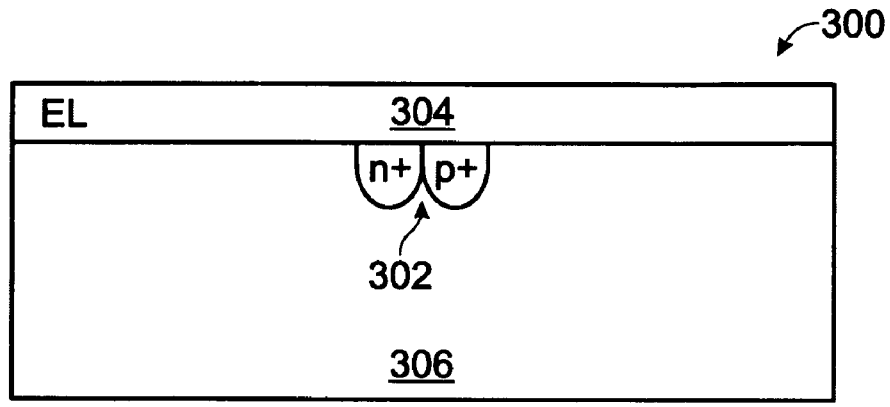
FIG. 3 is a partial cross-sectional view of a first aspect of the present invention electroluminescent device.

FIG. 3 is a partial cross-sectional view of a first aspect of the present invention electroluminescent device. As an alternative to the explanation of FIG. 1 (explained below), the device 300 may be understood, in its simplest form, to comprise a p+/n+ junction 302 and an electroluminescent layer 304 overlying the p+/n+ junction 302. As in FIG. 1 the p+/n+ junction 302 may be formed in a type IV semiconductor material substrate 306. It should be noted that the p+/n+ junction may be formed in other types of substrate materials, besides type IV materials. The type IV substrate materials are cited because of their use in conventional CMOS processes.

The type IV semiconductor material 306 can be Si, C, Ge, SiGe, and SiC. For example, SOI, bulk Si, Si on glass, and Si on plastic substrates may be used. Again, as in FIG. 1, the electroluminescent layer 304 is a material such as nanocrystalline Si, nanocrystalline Ge, fluorescent polymers, or type II–VI materials such as ZnO, ZnS, ZnSe, CdSe, and CdS.

Although not shown, an insulator film can be formed interposed between the substrate and the electroluminescent layer 304. Further, a conductive electrode can be formed overlying the electroluminescent layer 304. See FIG. 1 for these aspects of the device.

Figure 4:
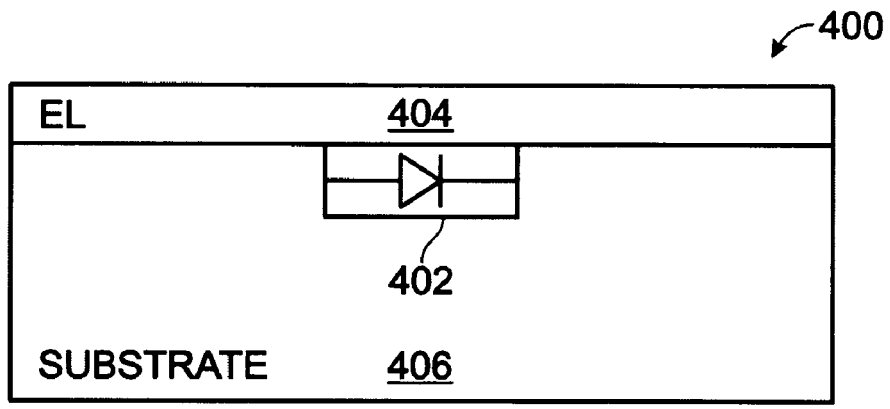
FIG. 4 is a partial cross-sectional view of a second aspect of the present invention electroluminescent device.

FIG. 4 is a partial cross-sectional view of a second aspect of the present invention electroluminescent device. In its simplest form, the device 400 of FIG. 4 can be understood to be a diode 402 and an electroluminescent layer 404 overlying the diode 402. As in FIGS. 1 and 3, the diode 402 is formed in one of the above-mentioned type IV semiconductor material substrates 406. Also as in FIGS. 1 and 3, the electroluminescent layer 404 is formed from one of the above-mentioned EL materials. See FIG. 1 for the optional use of an insulator film interposed between the substrate and the electroluminescent layer, and/or a conductive electrode overlying the electroluminescent layer.

Figure 5:
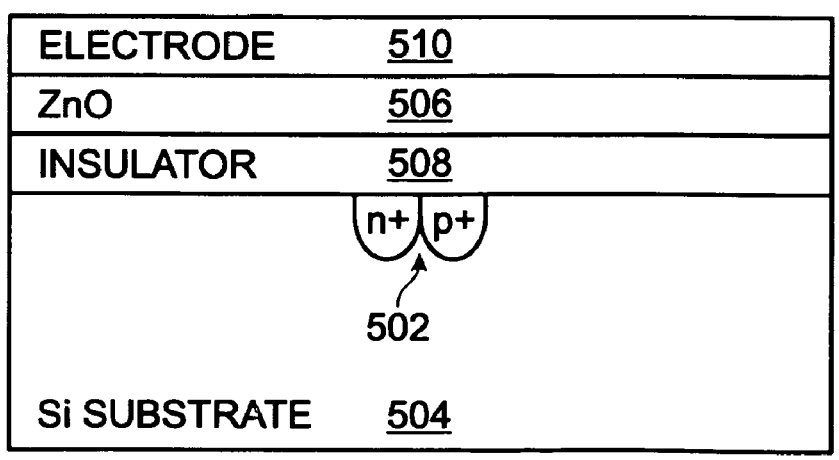
FIG. 5 is a partial cross-sectional view of the present invention ZnO electroluminescent device.

FIG. 5 is a partial cross-sectional view of the present invention ZnO electroluminescent device. The device 500 comprises a p+/n+ junction 502 formed in a Si substrate 504. A ZnO layer 506 overlies the p+/n+ junction 502. In some (optional) aspects, an insulator layer 508 is interposed between the p+/n+ junction 502 and the ZnO layer 506. In another (optional) aspect, a conductive electrode 510 overlies the ZnO layer 506. The p+/n+ junction 502 can be formed in a SOI, bulk Si, Si on glass, or Si on plastic substrate.

Figure 1:
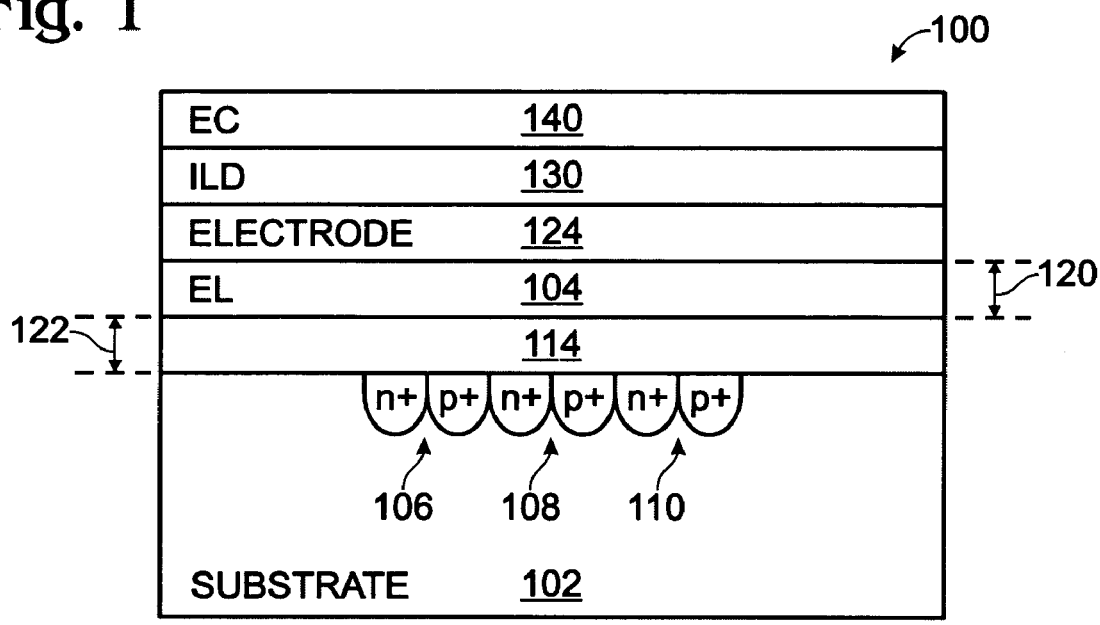
FIG. 1 is a partial cross-sectional view of the present invention electroluminescent device.

FIG. 1 is a partial cross-sectional view of the present invention electroluminescent device. The device 100 comprises a type IV semiconductor material substrate 102 and an electroluminescent layer 104 overlying the substrate 102. A p+/n+ junction 106 is formed in the substrate 102, and the electroluminescent layer 104 overlies the p+/n+ junction 106.

In one aspect as shown, a plurality of p+/n+ junctions 106, 108, 110 (in this case 3 junctions) is formed in the substrate 102, and the electroluminescent layer 104 overlies the plurality of p+/n+ junctions 106–110. Although 3 p+/n+ junctions have been shown, the invention is not limited to any particular number.

Figure 2:
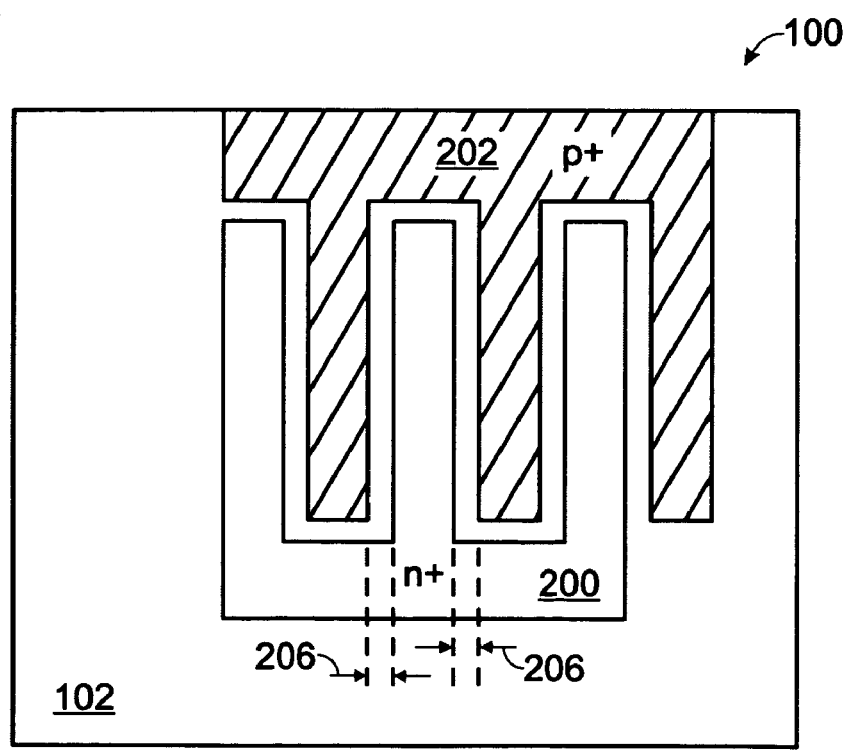
FIG. 2 is a plan view of the EL device substrate of FIG. 1.

FIG. 2 is a plan view of the EL device substrate 102 of FIG. 1. The plurality of p+/n+ junctions include a plurality of n+ regions 200 in the substrate 102, interleaved and adjacent a plurality of p+ regions 202 (cross-hatched) in the substrate 102. The gaps between the adjacent n+ and p+ regions have a width 206 in the range of 0 to 2 microns. In other aspects, the gaps have a width 206 in the range of 0.4 to 0.5 microns. As is typical of CMOS processes, the n+ regions 200 and p+ regions 202 have a resistivity of 0.5 ohm-cm, or less.

Returning to FIG. 1, the type IV semiconductor material substrate 102 can be a material such as Si, C, Ge, SiGe, and SiC. It should be understood that the present invention EL device 100 is not necessarily limited to only these materials. Rather, these materials have been cited because of their ease of use, as they are already integrated into conventional CMOS processes. Using Si as an example, the type IV semiconductor material substrate 102 can be Si on insulator (SOI), bulk Si, Si on glass, or Si on plastic. Again, this is a list of common substrate materials. Other, unnamed substrate materials are known by those skilled in the art.

The electroluminescent layer 104 can be a material such as nanocrystalline Si, nanocrystalline Ge, fluorescent polymers, or type II–VI materials such as ZnO, ZnS, ZnSe, CdSe, and CdS. In some aspects, the electroluminescent layer 104 has a thickness 120 in the range of 10 to 300 nanometers (nm).

In another aspect, the device 100 further comprises an insulator film 114 interposed between the substrate 102 and the electroluminescent layer 104. The insulator film 114 can be a material such as $SiO_2$, or high-k dielectrics such as $HfO_2$, $ZrO_2$, $TiO_2$, SiN, and $Al_2O_3$. In some aspects, the insulator layer 114 has a thickness 122 of less than 12 nm.

In some aspects, as shown, the device 100 further comprises a conductive electrode 124 overlying the electroluminescent layer 104. The conductive electrode 124 may be transparent, to further the emission of light. For example, a transparent electrode 124 can be made from a material such as ITO or ZnAlO.

In another aspect, the device 100 further comprises an interlevel dielectric (ILD) 130 overlying the electroluminescent layer 104. As shown, the interlevel dielectric layer 130 directly overlies the electrode 124. The interlevel dielectric 130 can be a material such as $SiO_2$, plasma-enhanced chemical vapor deposition (PECVD), or high-k dielectrics such as $HfO_2$, $ZrO_2$, $TiO_2$, SiN, and $Al_2O_3$.

In another aspect, the device 100 further comprises an emission conversion (EC) layer 140 overlying the electroluminescent layer 104. As shown, the emission conversion layer 140 directly overlies the interlevel dielectric layer 130. The emission conversion layer 140 includes a dye such as a fluorescent and phosphorescent dye, to convert short wavelength UV light emissions to the visible light band. In some aspects, the dye is inserted into the interlevel dielectric layer 130. That is, the interlevel dielectric and emission conversion layer are the same. In other aspects, the dye may be inserted into the conductive electrode 124.

It should be understood that although the device 100 is shown with an insulator layer 114, a top electrode 124, an interlevel dielectric layer 130, and an emission conversion layer 140, each of these layers is optional and the device may be fabricated with any combination, or none of these optional layers 114, 124, 130, and 140.

Functional Description

Figure 6:
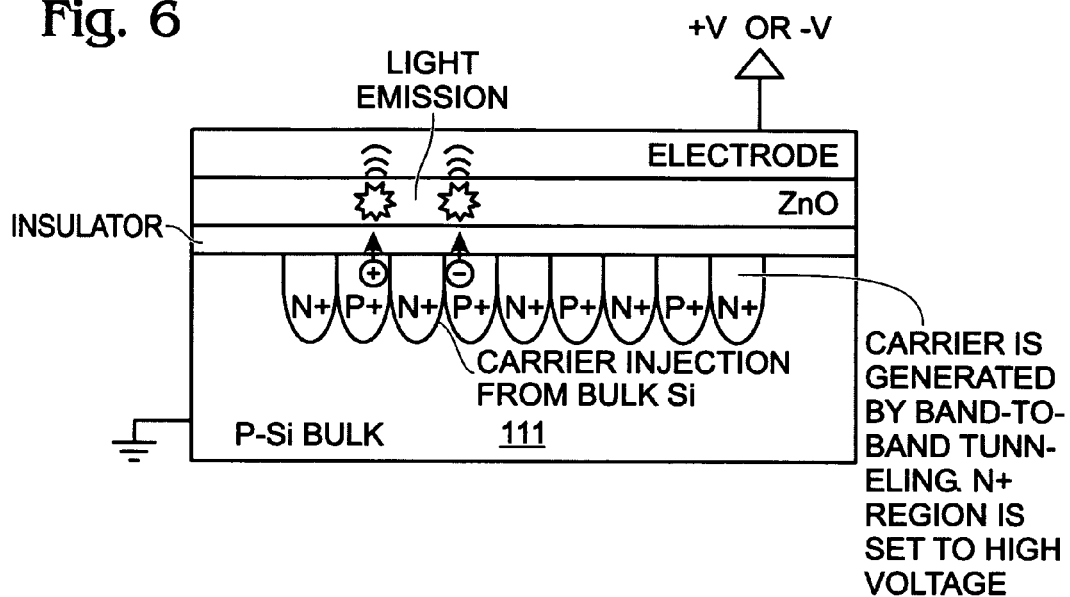
FIG. 6 is another partial cross-section view of the present invention EL device.

FIG. 6 is another partial cross-section view of the present invention EL device. FIG. 6 is used to support the explanation of an exemplary fabrication process. The device is shown fabricated on a (111) oriented p-type Si substrate, however, other orientations such as (001) are also possible. The p+ and n+ regions are ion implanted and annealed under the same conditions as the source and drain regions of N and PMOSFETs. A thermal oxidation is typically grown on the active area (exposed silicon) prior to ZnO deposition. Although this oxide insulation is not required for operation, the use of this oxide enables a lower voltage threshold for the emission of light. For example, a 7 nm thick oxide can be used. This layer can be a gate oxide, similar to the transistor gate oxide growth process. Other insulating films including the high-k class of dielectric materials such as $HfO_2$, $ZrO_2$, $TiO_2$, SiN, $Al_2O_3$, etc., may be used.

As shown, ZnO is deposited over the optional oxide dielectric layer. This can be accomplished in a number of ways. In one aspect, dc sputtering is used to deposit Zn to a thickness of 200 nm, followed by a thermal oxidation at either 410 or 800° C., in a clean dry air (CDA) environment. This is known to result in a random phase ZnO film.

Figure 7:
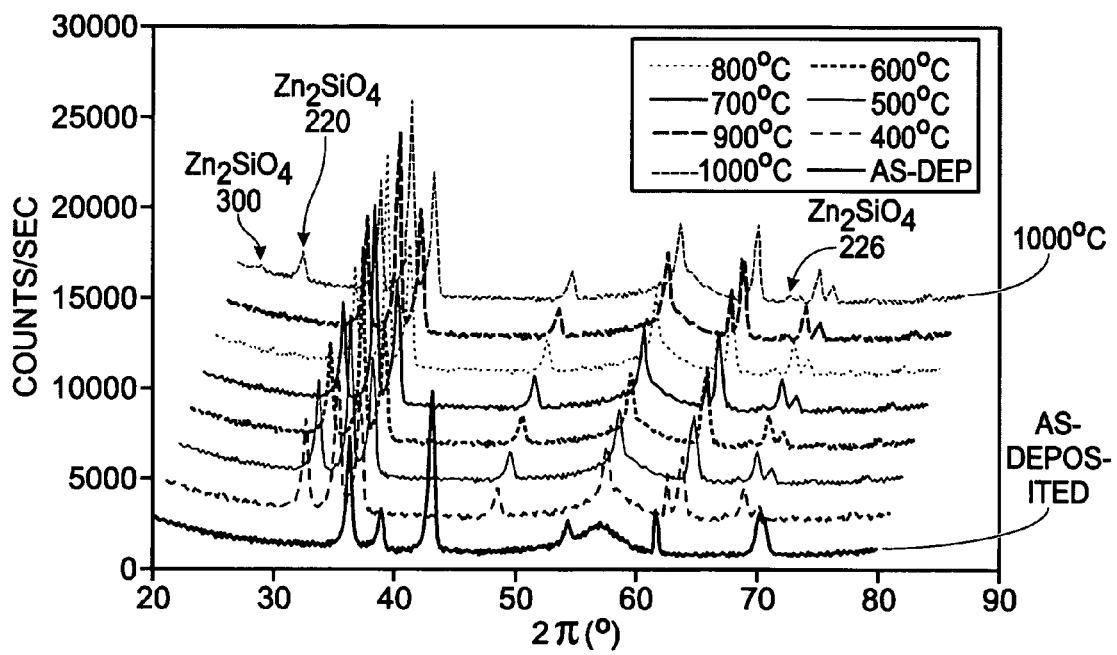
FIG. 7 is a graph illustrating x-ray diffraction (XRD) data that confirms the conversion of metallic Zn into the random ZnO at temperatures from 400 degree to 900 degree C.

FIG. 7 is a graph illustrating x-ray diffraction (XRD) data that confirms the conversion of metallic Zn into the random ZnO at temperatures from 400 degree to 900 degree C. Temperatures higher than 900 degrees C. typically generate Zn silicate crystallites. The strongest peak occurs at about 34.4°, corresponding to the ZnO (002) phase, also known as the c-axis phase. The mean crystallite size is estimated from the peak widths, and is found to be 69 nm for the 800° C. annealed film, and about 42 nm for the 400° C. annealed film.

Alternately, the ZnO can be deposited by radio frequency (RF) sputter deposition, atomic layer deposition (ALD), metalorganic chemical vapor deposition (MOCVD), or even spin-on with a sol-gel precursor. Each technique generates varying degrees of crystal orientation that may impact the efficiency of the EL device.

Although a specific ZnO EL device has been described, it is possible to make other materials function in a similar fashion. Other such materials may be, for example, ZnS, ZnSe, CdSe, CdS, known organic phosphors, nanocrystalline silicon, nanocrystalline germanium, or fluorescent polymers.

The top conductive gate, or electrode can be a transparent, although transparency is not required and is deemed to be optional. Indium tin oxide (ITO) or ZnAlO are well-known materials that can be used for a transparent conductive gate. After the gate is photolithographically defined, the stack is etched to remove the ITO, stopping partly into the ZnO. A wet etch in dilute HCl effectively removes the remaining ZnO in the exposed areas. The photoresist is removed and an interlayer dielectric, PECVD TEOS or SiO2 may be deposited. The contacts to the silicon are patterned and etched, followed by a metal layer deposition, pattern, and etch.

A ZnO film (or one of the above-mentioned EL materials) is placed in close proximity to a n+/p+ junction. When the n+/p+ junction is reverse biased, hot carriers are generated into the ZnO material, causing the light emission. The n+/p+ junction can be made on any semiconducting material, in this example the n+/p+ junction is formed in silicon using conventional CMOS compatible process techniques. The distance between the n+ and p+ regions helps determine the luminescent intensity and onset voltage.

Figure 8:
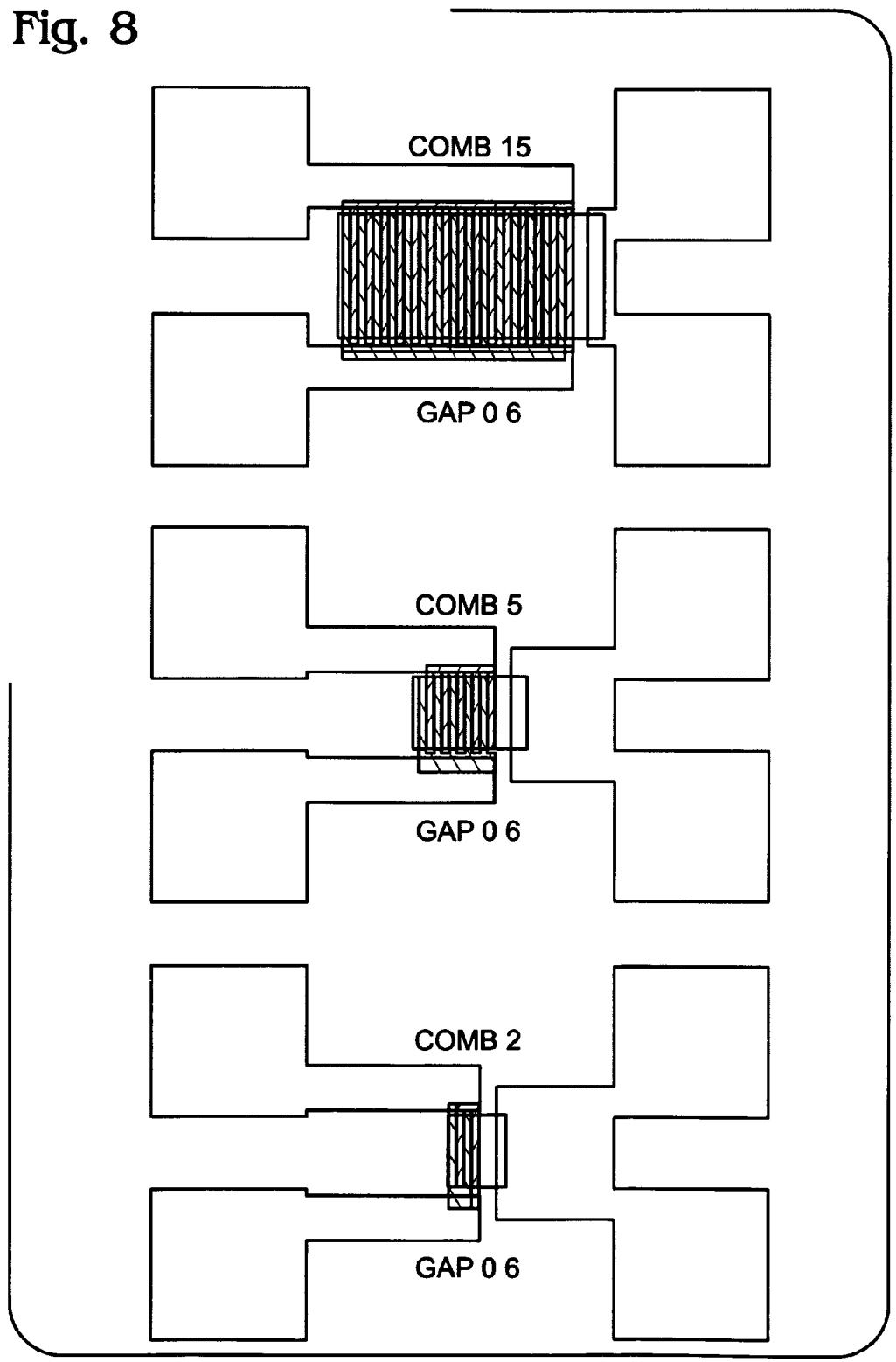
FIG. 8 is a plan view of 3 different device layouts.

FIG. 8 is a plan view of 3 different device layouts. The bottom view shows an El device made with 2 p+/n+ junctions. The middle view shows an EL device made of 5 p+/n+ junctions. The top view shows an El device made from 15 p+/n+ junctions.

Figure 9:
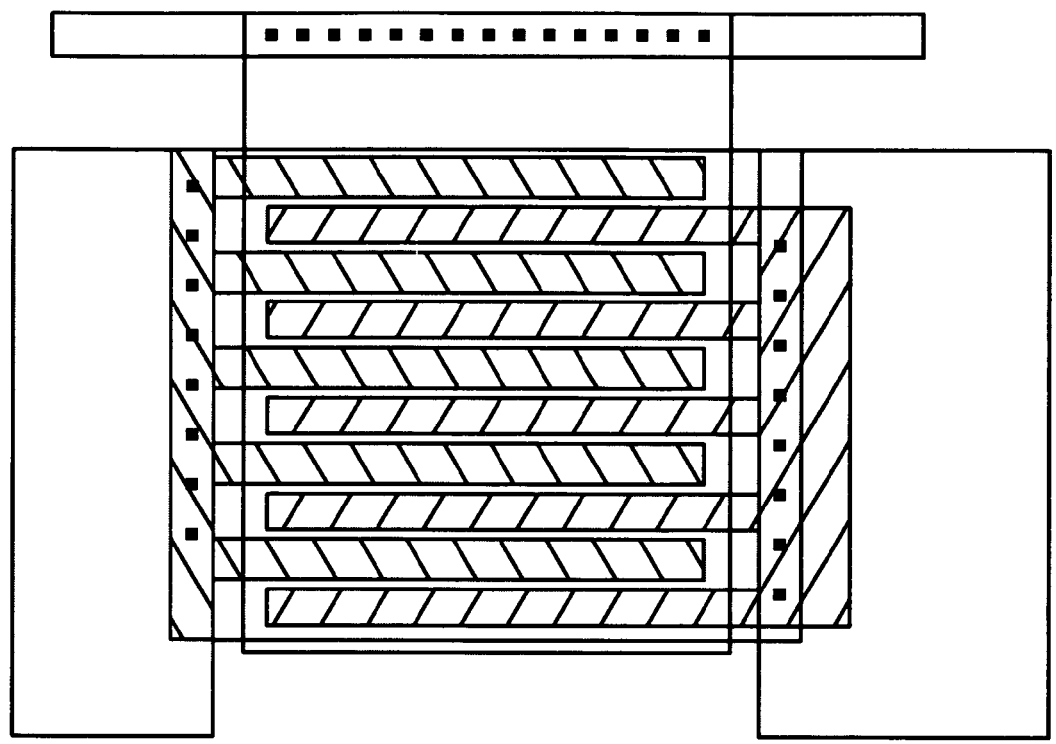
FIG. 9 is a close-up illustration of the center device of FIG. 8.

FIG. 9 is a close-up illustration of the center device of FIG. 8. The device has 5 teeth in the comb structure and a gap of 0.6 μm between adjacent n+ and p+ regions. The device emits light when turned on using a dc bias of 15 volts applied to the n+ region. The light emission is steady and unwavering when the p+ region is grounded and a positive bias is applied to the n+ region, effectively reverse biasing the pn junction.

The emitted light is visible by the naked eye and, therefore, includes wavelengths that are greater than 400 nm. The photoluminescence (generation of light from a sample excited by shorter wavelengths light) of ZnO is generally known to exhibit emission at under 400 nm. In fact, peaks are usually seen between 370 nm and 380 nm. Therefore, much of the electroluminescence occurs at wavelengths below 400 nm. This emitted UV can be converted to the visible region by using fluorescent or phosphorescent dyes. For miniature display applications, a coating above the ZnO efficiently converts the UV to visible light. This light can then be used in combination with liquid crystal shutters, color filters, or bandpass filters, to produce almost any colored light source.

The observed emission originates from the recombination of electrons and holes in the ZnO phosphor material and takes place through a direct intrinsic band-to-band radiative recombination mechanism (UV) and also through a defect (such as O-vacancies, O interstitials, and Zn interstitials) mediated radiative recombination that allows for the generation of visible light.

The mechanism for light emission is likely due to injection of "hot" carriers from this reversed bias junction over the potential barrier into the ZnO phosphor material. The process is in some ways analogous to hot carrier injection in short channel MOS devices. A p-n diode in the silicon, adjacent to the phosphor (in this case ZnO) is reversed biased so that a large avalanche breakdown current flows. As used herein, breakdown does not mean the destructive breakdown that is often associated with the thin gate oxide of MOS devices, but rather the non-destructive avalanche mode of operation of a p-n junction diode. In a reverse bias pn-junction diode, most of the voltage drop takes place across the junction. In this mode of operation, minority carriers are injected from both sides of the junction (holes from the n+, and electrons from the p+) into the high field depletion region. Once there, they are accelerated toward the other side of the junction, acquiring kinetic energy above the potential of the band edge, i.e., they become "hot". Along the way, these energetic electrons can scatter to generate new additional electron-hole pairs by a process called impact ionization. Above a threshold field, each newly generated carrier is also able to generate additional carriers, and the process continues until, in an "avalanche"—like process, a high current flows. Because these carriers are "hot" (i.e., possess energy above the band edge), some of them are energetic enough, and have the right momentum, to surmount the barrier and to be injected from the Si into the ZnO where they radiatively recombine to produce the observed light.

The emission is sustained by the continued injection of both electrons and holes from the pn junction region between the two types of Si. Were only one type of carrier injected, the light emission could not be sustained as observed.

For the case in which $SiO_2$ is interposed between the p+/n+ junction and the ZnO layer, the carriers may also be injected via either direct tunneling, or Fowler-Nordheim tunneling (assuming the fields are correct) through the thin $SiO_2$ barrier, as well as over the barriers into the ZnO where they can radiatively recombine to generate light.

Under the right circumstances, and insuring that destructive breakdown does not occur in either of the ZnO or $SiO_2$ overlayers, the injection of carriers can be modulated by a gate voltage.

The avalanche breakdown voltage of Si is proportional to the critical field, $E_{cr}$ and the dielectric constant of the semiconductor, is inversely proportional to doping, and is given by:

$$V_{br} \sim (E_{cr}^2 K_s e_o / 2q) * [(N_a + N_d) / N_a N_d]. \qquad (1)$$

$E_{cr}$ is the critical breakdown field and is a physical constant for a given semiconductor. Changing the semiconductor material results in a different critical field and a different dielectric constant, but in principal device operation, though quantitatively changed, remains substantially the same.

In principle, the operation of the device can be altered by changing the doping. Any increase of doping in either side of the junction results in a decrease of the breakdown voltage, potentially leading to lower operating voltage for the device. However, it may be necessary to avoid too high a doping, as at higher doping levels, Zener (band to band tunneling) breakdown becomes dominant and there is likely to be less generation of energetic carriers.

For a one sided junction, the breakdown voltage is controlled by the doping in the more lightly doped region. Although in some aspects, a lower threshold is observed for the devices with $SiO_2$ at the interface between the ZnO layer and the p+/n+ junction. In these devices, boron (p-type) dopant may be depleted from the surface during the thermal oxidation step. This occurrence leads to a higher breakdown voltage and thus less energetic carriers available at a given voltage.

Temperature also has an impact on device operation. For avalanche breakdown, a decrease in temperature leads to a lower breakdown voltage, as there is less lattice scattering of the carriers at lower temperature. The carriers are able to build up more energy because they travel further before the finally scatter. A lower voltage is thus required, which leads to lower operating voltage.

Further, the light emitted from the exemplary ZnO device can be rapidly modulated by changing the bias on the n+ region of Si. Because emission is controlled by operation of a pn diode, it is very fast and does not require the high field operation associated with conventional capacitive type EL devices. Also, ac operation is unnecessary, making the present invention device much more compatible with Si IC integration.

Figure 10:
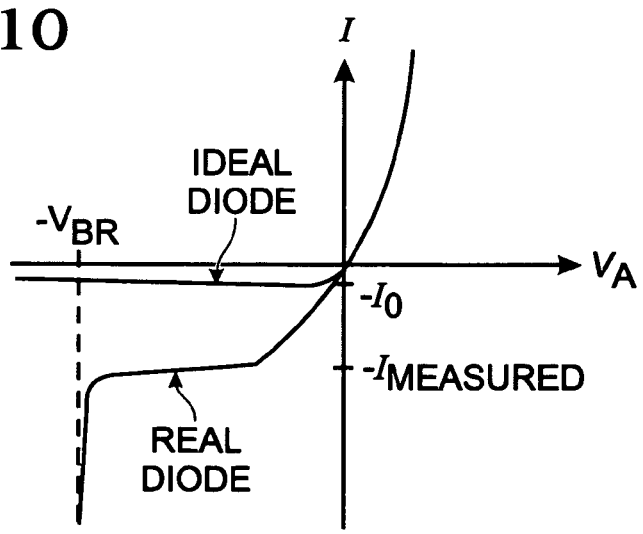
FIGS. 10 through 12 illustrate relevant diode characteristics of the present invention exemplary ZnO device.
Figure 11:
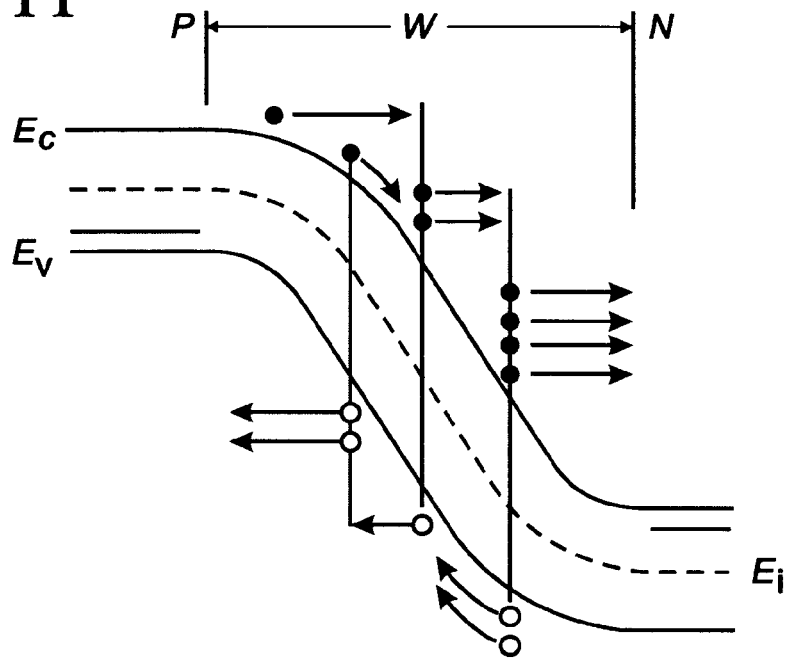
Figure 12:
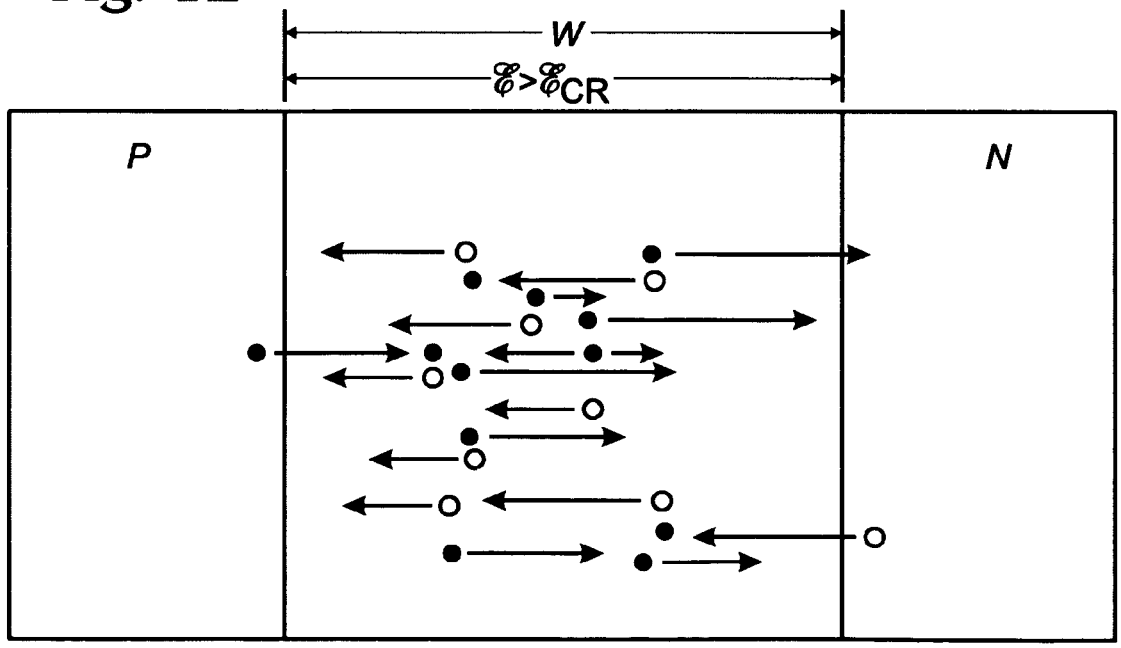

FIGS. 10 through 12 illustrate relevant diode characteristics of the present invention exemplary ZnO device. FIG. 10 is graph highlighting the avalanche mode of reverse biased operation for a p+/n+ junction. FIG. 11 demonstrates the avalanche multiplication of electrons and holes, viewed energetically. FIG. 12 demonstrates the avalanche multiplication of electrons and holes, viewed spatially.

Figure 13:
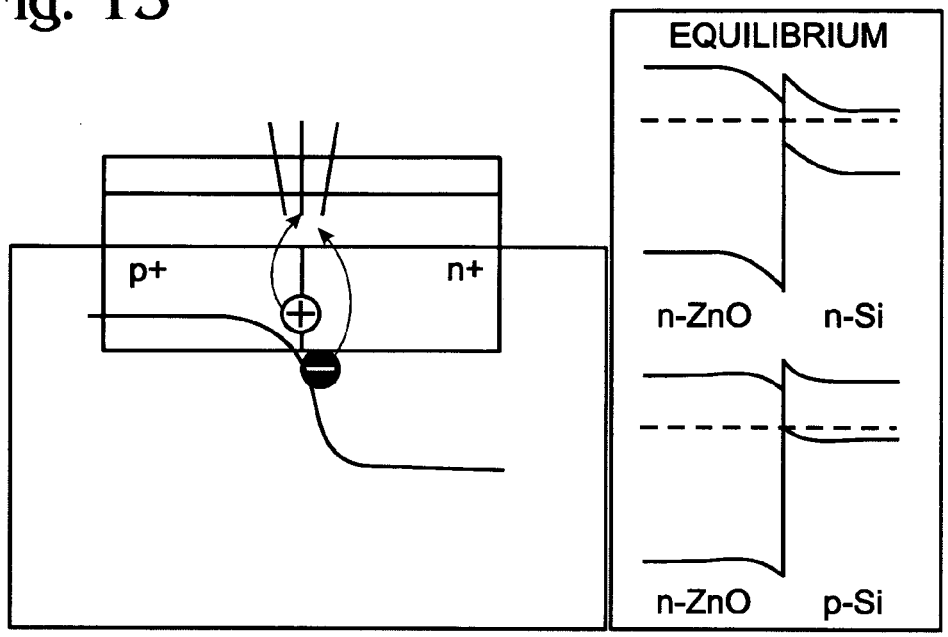
FIGS. 13 and 14 are band diagrams of the device at equilibrium and under bias.
Figure 14:
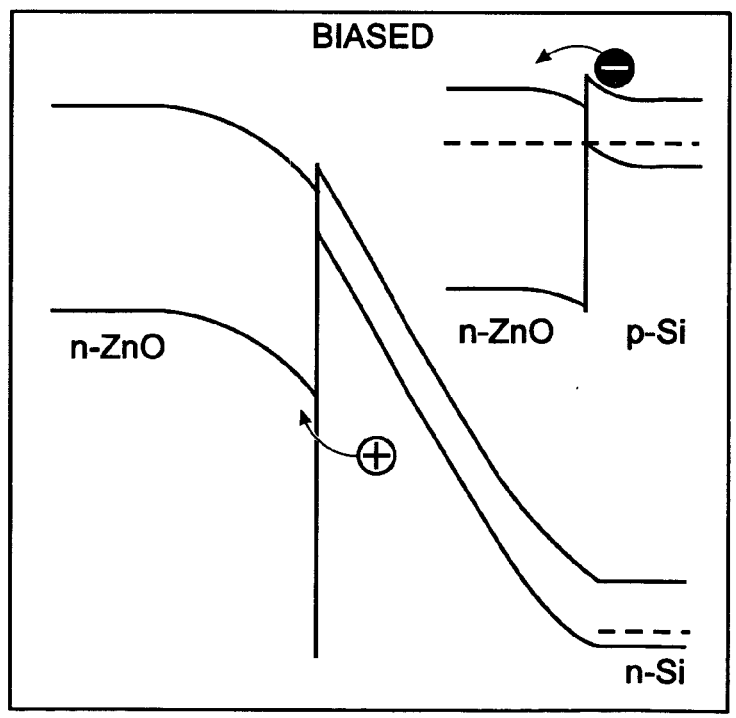

FIGS. 13 and 14 are band diagrams of the device at equilibrium and under bias. FIG. 13 is a band diagram of the interface between Si and ZnO for n+ and p+ Si. FIG. 14 is a band diagram of the EL device under reverse bias. As shown, the reverse bias condition permits the injection of electrons and holes into the ZnO from the Si.

FIGS. 16 through 21 are plan and partial cross-sectional views of steps in the completion of an exemplary ZnO electroluminescent device. In FIG. 16 a square window is opened, forming an active area on a thermally oxidized silicon wafer. In FIG. 17, the n+ implant region is patterned and implanted. In FIG. 18, the p+ implant (cross-hatched) region is patterned and implanted. Then, the n+ and p+ implants are activated with a high temperature anneal. In FIG. 19 an optional gate oxide is grown on the exposed silicon regions. Then, ZnO is deposited. An optional top transparent conductive gate (ITO) is deposited, patterned, and etched. In FIG. 20 an interlayer dielectric layer, such as PECVD TEOS oxide, is deposited. Contact holes are pattered and etched. In FIG. 21 a metallization layer of Al is deposited, patterned, and etched, completing the device fabrication.

Figure 22:
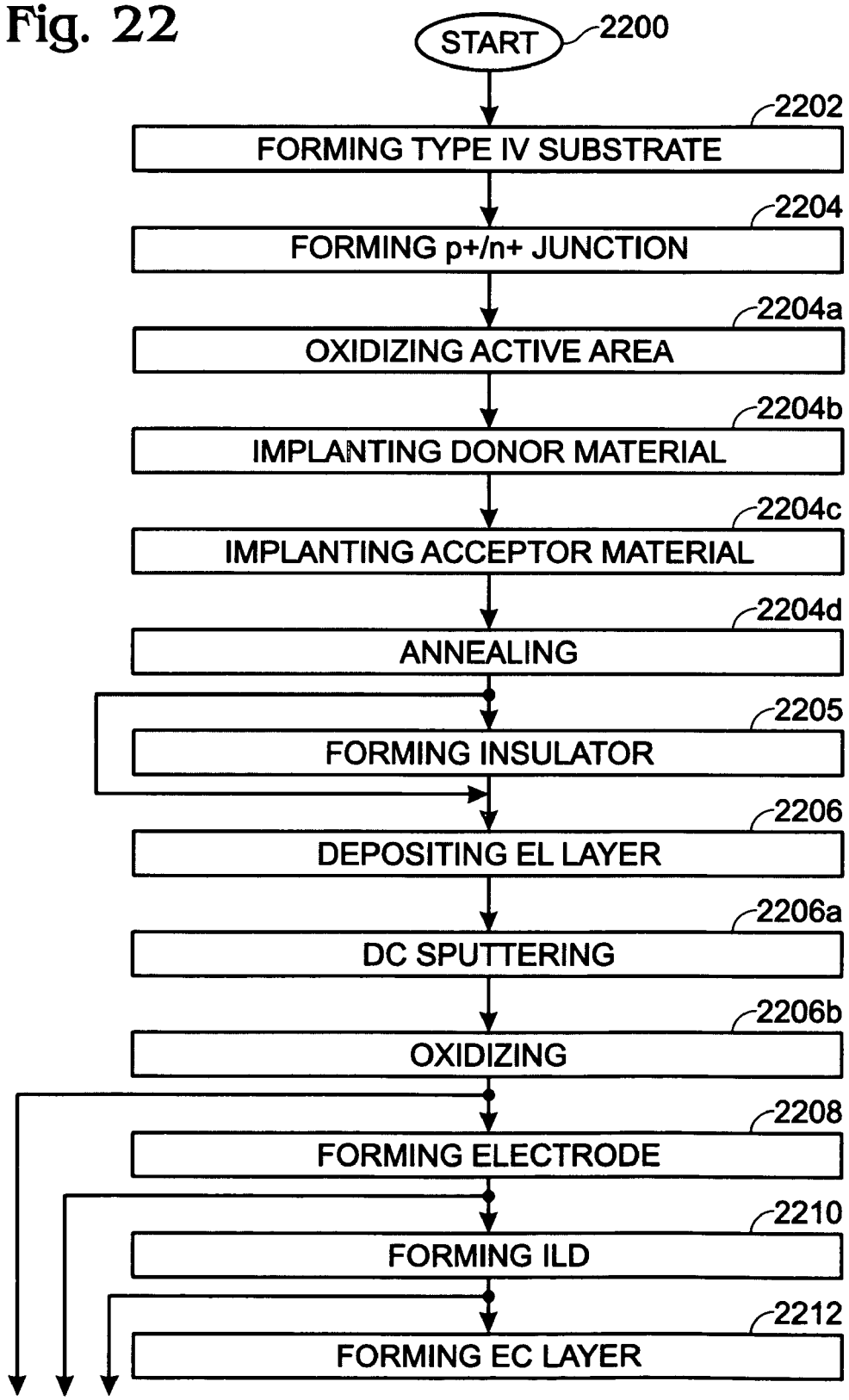
FIG. 22 is a flowchart illustrating the present invention method for forming an electroluminescent device.

FIG. 22 is a flowchart illustrating the present invention method for forming an electroluminescent device. Although the method (and methods below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 2200.

Step 2202 provides a type IV semiconductor material substrate. Step 2204 forms a p+/n+ junction in the substrate. Step 2206 forms an electroluminescent layer overlying the substrate. That is, the electroluminescent layer is formed overlying the p+/n+ junction.

In some aspects, providing a type IV semiconductor material substrate in Step 2202 includes providing the substrate from a material such as Si, C, Ge, SiGe, or SiC. For example, the substrate can be SOI, bulk Si, Si on glass, or Si on plastic.

In another aspect, forming an electroluminescent layer overlying the substrate in Step 2206 includes forming an electroluminescent layer from a material such as nanocrystalline Si, nanocrystalline Ge, fluorescent polymers, or type II–VI materials such as ZnO, ZnS, ZnSe, CdSe, and CdS. In one aspect, Step 2206 forms an electroluminescent layer having a thickness in the range of 10 to 300 nanometers (nm).

Step 2206 may deposit the electroluminescent layer using a process such as dc sputtering, RF sputtering, atomic layer deposition (ALD), metalorganic chemical vapor deposition (MOCVD), or spin-on deposition using a sol-gel precursor. For example, Step 2206a may dc sputtering deposit Zn. Then, Step 2206b oxidizes the Zn in an atmosphere including clean dry air, at a temperature greater than 300 degrees C.

In another aspect, Step 2205 forms an insulator film interposed between the substrate and the electroluminescent layer. The insulator film of Step 2205 can be a material such as SiO2, or high-k dielectrics such as HfO2, ZrO2, TiO2, SiN, and Al2O3. However, other unnamed insulating films are known to those skilled in the art. In some aspects, Step 2205 forms an insulator layer having a thickness of less than 12 nm.

In a different aspect, forming a p+/n+ junction in the substrate (Step 2204) includes forming a plurality of p+/n+ junctions. Then, Step 2206 forms the electroluminescent layer overlying the plurality of p+/n+ junctions. More explicitly, forming a plurality of p+/n+ junctions includes forming a plurality of n+ regions in the substrate, interleaved and adjacent a plurality of p+ regions in the substrate. In some aspects, gaps are formed between the n+ and p+ regions having a width in the range of 0 to 2 microns. In other aspects, the gaps have a width in the range of 0.4 to 0.5 microns.

In another aspect, forming a plurality of n+ regions in the substrate, interleaved and adjacent a plurality of p+ regions in the substrate includes substeps. Step 2204a oxidizes a substrate active area. Step 2204b implants donor material in a first patterned region of the active area. Step 2204c implants acceptor material in a second patterned region of the active area. Step 2204d anneals. Note, Step 2204c may be performed before Step 2204b. Further, implanting donor material and acceptor material in the first and second patterned regions, respectively, (Steps 2204b and 2204c) includes implanting with an impurity dosage and energy level sufficient to form a resistivity of 0.5 ohm-cm, or less, in the p+ and n+ regions. In some aspects, Step 2204d either laser anneals or thermal anneals at a temperature of greater than 600 degrees C.

In another aspect of the method, Step 2208 forms a conductive electrode overlying the electroluminescent layer. The conductive electrode may be a transparent electrode made from a material such as ITO or ZnAlO.

In one more aspect, Step 2210 forms an interlevel dielectric overlying the electroluminescent layer. The interlevel dielectric may be made from a material such as SiO2, plasma-enhanced chemical vapor deposition (PECVD), or high-k dielectrics such as HfO2, ZrO2, TiO2, SiN, and Al2O3.

In another aspect, Step 2212 forms an emission conversion (EC) layer overlying the electroluminescent layer including a dye selected from the group including a fluorescent and phosphorescent dye.

Figure 23:
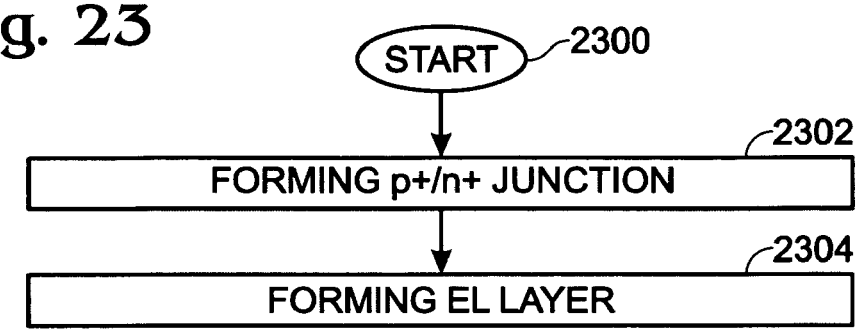
FIG. 23 is a flowchart illustrating a first aspect of the method for forming an electroluminescent device.

FIG. 23 is a flowchart illustrating a first aspect of the method for forming an electroluminescent device. The method starts at Step 2300. Step 2302 forms a p+/n+ junction. Step 2314 forms an electroluminescent layer overlying the p+/n+ junction. In some aspects, forming a p+/n+ junction in Step 2302 includes forming a p+/n+ junction in a type IV semiconductor material substrate, such as Si, C, Ge, SiGe, or SiC. For example, SOI, bulk Si, Si on glass, or Si on plastic substrates may be used.

In another aspect, forming an electroluminescent layer overlying the p+/n+ junction (Step 2304) includes forming an electroluminescent layer from a material such as nanocrystalline Si, nanocrystalline Ge, fluorescent polymers, or type II–VI materials such as ZnO, ZnS, ZnSe, CdSe, and CdS.

Figure 24:
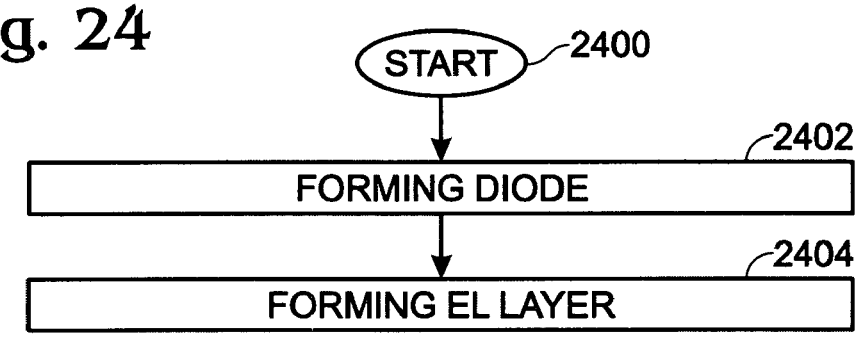
FIG. 24 is a flowchart illustrating a second aspect of the present invention method for forming an electroluminescent device.

FIG. 24 is a flowchart illustrating a second aspect of the present invention method for forming an electroluminescent device. The method starts at Step 2400. Step 2402 forms a diode. Step 2404 forms an electroluminescent layer overlying the diode. In some aspects, forming a diode in Step 2402 includes forming the diode in a type IV semiconductor material substrate, such as Si, C, Ge, SiGe, or SiC. For example, SOI, bulk Si, Si on glass, or Si on plastic substrates may be used.

In another aspect, forming an electroluminescent layer overlying the diode (Step 2404) includes forming an electroluminescent layer from a material such as nanocrystalline Si, nanocrystalline Ge, fluorescent polymers, or type II–VI materials such as ZnO, ZnS, ZnSe, CdSe, and CdS.

Figure 25:
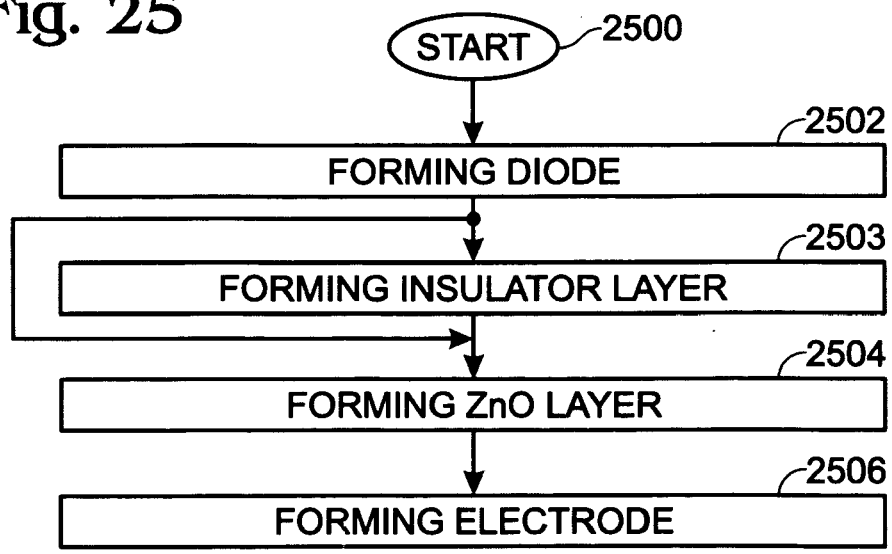
FIG. 25 is a flowchart illustrating the present invention method for forming a ZnO electroluminescent device.

FIG. 25 is a flowchart illustrating the present invention method for forming a ZnO electroluminescent device. The method starts at Step 2500. Step 2502 forms a diode in a Si substrate. Alternately stated, Step 2502 forms a p+/n+ junction in the substrate. Step 2502 may form the diode in a SOI, bulk Si, Si on glass, or Si on plastic substrate. Step 2504 forms a ZnO layer overlying the diode. In some aspects, Step 2503 forms an insulator layer interposed between the diode and the ZnO layer. In another aspect, Step 2506 forms a conductive electrode overlying the ZnO layer.

Figure 26:
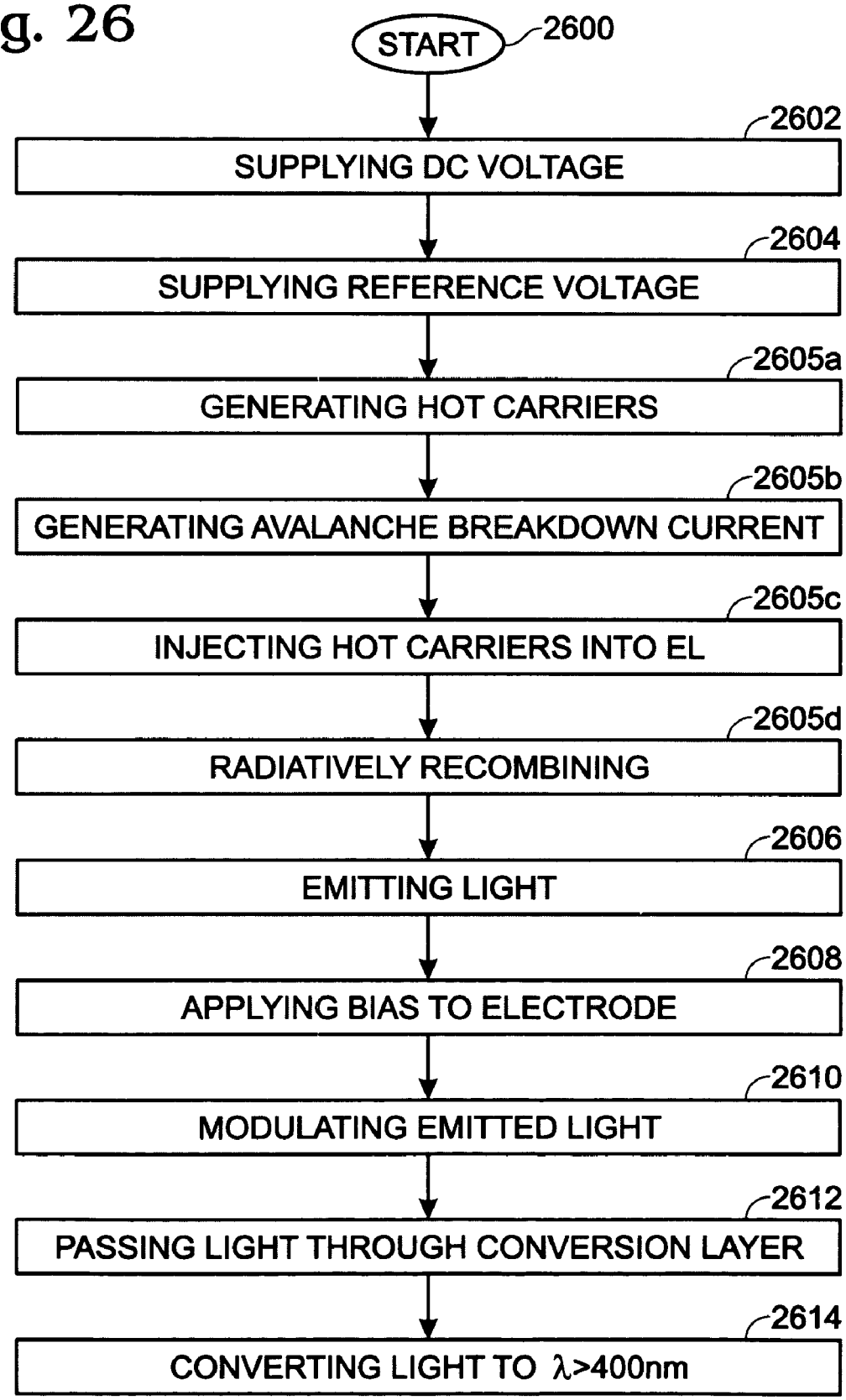
FIG. 26 is a flowchart illustrating the present invention method for operating an electroluminescent device.

FIG. 26 is a flowchart illustrating the present invention method for operating an electroluminescent device. The method starts at Step 2600. Step 2602 supplies a first dc voltage to an n+ region of a p+/n+ junction. Step 2604 supplies a reference voltage, such as ground, to a p+ region of the p+/n+ junctions. Step 2606 emits light from an electroluminescent layer overlying the p+/n+ junction.

In one aspect, supplying a first dc voltage to an n+ region of a p+/n+ junction in Step 2602 includes supplying a dc voltage at least 3.4 volts greater than the reference voltage (of Step 2604). In another aspect, emitting light from an electroluminescent layer overlying the p+/n+ junction (Step 2606) includes emitting light from an electroluminescent material such as nanocrystalline Si, nanocrystalline Ge, fluorescent polymers, or type II–VI materials such as ZnO, ZnS, ZnSe, CdSe, and CdS. For example, Step 2606 may emit light in the wavelengths between 350 and 700 nanometers (nm). In another aspect, Step 2606 emits light with a wavelength in the range of 370 and 390 nm.

In a different aspect, Step 2608 applies a bias voltage, within the range of 40% to 60% of the first dc voltage, to an electrode overlying the electroluminescent layer. Then, Step 2610 modulates the emitted light in response to the bias voltage.

In another aspect, Step 2612 passes the emitted light through an emission conversion layer, including a dye such as a fluorescent or phosphorescent dye. Then, Step 2614 converts emitted light having a wavelength ($\lambda$) less than 400 nm, into light having a wavelength of greater than 400 nm.

In one aspect, Step 2605a generates hot carriers in the p+/n+ junction in response to supplying a first dc voltage to the n+ region (Step 2602) and a reference voltage to the p+ region (Step 2604). Step 2605b generates an avalanche breakdown current in the p+/n+ junction. Step 2605c injects hot carriers into the electroluminescent layer. Then, Step 2606 emits light in response to radiatively recombining the hot carriers in the electroluminescent layer.

In another aspect, supplying a first dc voltage to an n+ region of a p+/n+ junction (Step 2602) includes supplying a dc voltage modulated at a first rate of 1 gigahertz (GHz), or less. Then, Step 2606 emits light modulated at the first rate.

In one aspect, supplying a first dc voltage to an n+ region of a p+/n+ junction (Step 2602) includes simultaneously supplying the dc voltage to a plurality of n+ regions. Then, supplying a reference voltage to a p+ region of the p+/n+ junctions (Step 2604) includes simultaneously supplying the reference voltage to a plurality of p+ regions interleaved between the n+ regions. In one aspect, Step 2602 supplies a first dc voltage level responsive to a gap between the interleaved n+ and p+ regions. For example, Step 2602 supplies a voltage of (at least) 7 volts in response to a gap of about 0.6 microns.

In another aspect, supplying a first dc voltage to an n+ region of a p+/n+ junction in Step 2602 includes supplying an impulse signal with rise times and fall times of less than 10 nanoseconds.

EL devices have been provided, formed over type IV substrate material. Corresponding EL fabrication processes have also been described. Example processes have been disclosed to help clarify the invention. However, the invention is not limited to merely these examples. Further, a ZnO EL device has been described. However, the invention is applicable to a much wider range of EL materials. The present invention can be used as a light-emitting device, in optoelectronics, photonic interconnects, and display technologies. Other variations and embodiments of the invention will occur to those skilled in the art.

We claim:

1. A method for forming an electroluminescent device, the method comprising:
   providing a type IV semiconductor material substrate;
   forming a plurality of n+ regions in the substrate, interleaved and adjacent a plurality of p+ regions in the substrate, with gaps in the substrate, between the n+ and p+ regions, having a width in the range of 0.4 to 0.5 microns; and,
   forming an electroluminescent layer with a hot carrier interface overlying the plurality of p+/n+ junctions for radiatively recombining injected holes and electrons.

2. The method of claim 1 wherein providing a type IV semiconductor material substrate includes providing the substrate from a material selected from the group consisting of Si, C, Ge, SiGe, and SiC.

3. The method of claim 1 wherein providing a type IV semiconductor material substrate includes providing the substrate selected from the group consisting of Si on insulator (SOI), bulk Si, Si on glass, and Si on plastic.

4. The method of claim 1 wherein forming an electroluminescent layer overlying the substrate includes forming an electroluminescent layer from a material selected from the group consisting of nanocrystalline Si, nanocrystalline Ge, fluorescent polymers, and type II–VI materials selected from the group consisting of ZnO, ZnS, ZnSe, CdSe, and CdS.

5. The method of claim 4 wherein forming an electroluminescent layer includes forming an electroluminescent layer having a thickness in the range of 10 to 300 nanometers (nm).

6. The method of claim 1 further comprising:
   forming an insulator film interposed between the substrate and the electroluminescent layer.

7. The method of claim 6 wherein forming an insulator film interposed between the substrate and the electroluminescent layer includes forming the insulator layer from a material selected from the group consisting of SiO2, and high-k dielectrics selected from the group consisting of HfO2, ZrO2, TiO2, SiN, and Al2O3.

8. The method of claim 6 wherein forming an insulator layer includes forming an insulator layer having a thickness of less than 12 nm.

9. The method of claim 1 wherein forming a plurality of n+ regions in the substrate, interleaved and adjacent a plurality of p+ regions in the substrate includes:
   oxidizing a substrate active area;
   implanting donor material in a first patterned region of the active area;
   implanting acceptor material in a second patterned region of the active area; and,
   annealing.

10. The method of claim 9 wherein implanting donor material and acceptor material in the first and second patterned regions, respectively, includes implanting with an impurity dosage and energy level sufficient to form a resistivity of 0.5 ohm-cm, or less, in the p+ and n+ regions.

11. The method of claim 9 wherein annealing includes a process selected from the group consisting of laser annealing and thermal annealing at a temperature of greater than 600 degrees C.

12. The method of claim 1 further comprising:
   forming a conductive electrode overlying the electroluminescent layer.

13. The method of claim 12 wherein forming a conductive electrode overlying the electroluminescent layer includes forming a transparent electrode.

14. The method of claim 13 wherein forming a transparent electrode includes forming a transparent electrode from a material selected from the group consisting of ITO and ZnAlO.

15. The method of claim 1 further comprising:
   forming an interlevel dielectric overlying the electroluminescent layer.

16. The method of claim 15 wherein forming an interlevel dielectric overlying the electroluminescent layer includes forming an interlevel dielectric from a material selected from the group consisting of SiO2, plasma-enhanced chemical vapor deposition (PECVD), and high-k dielectrics selected from the group consisting of HfO2, ZrO2, TiO2, SiN, and Al2O3.

17. The method of claim 1 further comprising:
   forming an emission conversion layer overlying the electroluminescent layer including a dye selected from the group consisting of a fluorescent and phosphorescent dye.

18. The method of claim 1 wherein forming an electroluminescent layer overlying the substrate includes depositing the electroluminescent layer using a process selected from the group consisting of dc sputtering, radio frequency (RF) sputtering, atomic layer deposition (ALD), metalorganic chemical vapor deposition (MOCVD), and spin-on deposition using a sol-gel precursor.

19. The method of claim 1 wherein forming an electroluminescent layer overlying the substrate includes:
   dc sputter depositing Zn;
   oxidizing the Zn in an atmosphere including clean dry air at a temperature greater than 300 degrees C.

20. A method for operating an electroluminescent device, the method comprising:
   supplying a first dc voltage to an n+ region of a p+/n+ junction, at least 3.4 volts greater than a reference voltage;
   supplying reference voltage to a p+ region of the p+/n+ junction;
   injecting holes and electron from the p+/n+ junction into a hot carrier interface of an electroluminescent layer;
   recombining the holes and electrons in the hot carrier interface; and,
   emitting light from the electroluminescent layer hot carrier interface overlying the p+/n+ junction, where the electroluminescent material is selected from the a consisting of nanocrystalline Si, nanocrystalline Ge, fluorescent polymers, and type II–VI materials selected from the group consisting of ZnO, ZnS, ZnSe, CdSe, and CdS.

21. The method of claim 20 wherein emitting light from an electroluminescent layer overlying the p+/n+ junction includes emitting light in the wavelengths between 350 and 700 nanometers (nm).

22. The method of claim 21 wherein emitting light from an electroluminescent layer overlying the p+/n+ junction includes emitting light in the wavelengths between 370 and 390 nm.

23. The method of claim 20 further comprising:
   applying a bias voltage, in the range of 40% to 60% of the first voltage, to an electrode overlying the electroluminescent layer; and, modulating the emitted light in response to the bias voltage.

24. The method of claim 20 further comprising:
passing the emitted light through an emission conversion layer, including a dye selected from the group consisting of fluorescent and phosphorescent dyes; and,
converting emitted light having a wavelength less than 400 nm, into light having a wavelength of greater than 400 nm.

25. The method of claim 20 wherein injecting holes and electron from the p+/n+ junction includes injecting holes and electrons in response to supplying a first voltage to the n+ region and a reference voltage to the p+ region; and,
generating an avalanche breakdown current in the p+/n+ junction.

26. The method of claim 20 wherein supplying a first voltage to an n+ region of a p+/n+ junction includes supplying an ac voltage modulated at a first rate of 1 gigahertz (GHz), or less; and,
wherein emitting light from an electroluminescent layer overlying the p+/n+ junction includes modulating the emitted light at the first rate.

27. The method of claim 20 wherein supplying a first voltage to an n+ region of a p+/n+ junction includes simultaneously supplying the first voltage to a plurality of n+ regions;
wherein supplying a reference voltage to a p+ region of the p+/n+ junctions includes simultaneously supplying the reference voltage to a plurality of p+ regions interleaved between the n+ regions.

28. The method of claim 27 wherein supplying a first voltage includes supplying a dcwoltage level responsive to a gap between the interleaved n+ and p+ regions.

29. The method of claim 28 wherein supplying a first dc voltage level responsive to a gap between the interleaved n+ and p+ regions includes supplying a voltage of 7 volts in response to a gap of about 0.6 microns.

30. The method of claim 20 wherein supplying a first voltage to an n+ region of a p+/n+ junction includes supplying an impulse signal with rise times and fall times of less than 10 nanoseconds.

31. An electroluminescent device, the device comprising:
a type IV semiconductor material substrate;
a plurality of n+ regions in the substrate, interleaved and adjacent a plurality of p+ regions in the substrate, with gaps in the substrate, between the adjacent n+ and p+ regions, having a width in the range of 0.4 to 0.5 microns; and,
an electroluminescent layer overlying the substrate, with a hot carrier interface for radiatively recombining holes and electrons injected from the plurality of p+/n+ junctions.

32. The device of claim 31 wherein the type IV semiconductor material substrate is a material selected from the group consisting of Si, C, Ge, SiGe, and SjC.

33. The device of claim 31 wherein the type IV semiconductor material substrate is a substrate selected from the group consisting of Si on insulator (SOI), bulk Si, Si on glass, and Si on plastic.

34. The device of claim 31 wherein the electroluminescent layer is a material selected from the group consisting of nanocrystalline Si, nanocrystalline Ge, fluorescent polymers, and type II–VI materials selected from the group consisting of ZnO, ZnS, ZnSe, CdSe, and CdS.

35. The device of claim 34 wherein the electroluminescent layer has a thickness in the range of 10 to 300 nanometers (nm).

36. The device of claim 31 further comprising:
an insulator film interposed between the substrate and the electroluminescent layer.

37. The device of claim 36 wherein the insulator film is a material selected from the group consisting of SiO2, and high-k dielectrics selected from the group consisting of HfO2, ZrO2, TiO2, SiN, and Al2O3.

38. The device of claim 36 wherein the insulator layer has a thickness of less than 12 nm.

39. The device of claim 31 wherein the plurality of n+ and p+ regions have a resistivity of 0.5 ohm-cm, or less.

40. The device of claim 31 further comprising:
a conductive electrode overlying the electroluminescent layer.

41. The device of claim 40 wherein the conductive electrode is transparent.

42. The device of claim 41 wherein the transparent electrode is a material selected from the group consisting of ITO and ZnAlO.

43. The device of claim 31 further comprising:
an interlevel dielectric overlying the electroluminescent layer.

44. The device of claim 43 wherein the interlevel dielectric is a material selected from the group consisting of SiO2, plasma-enhanced chemical vapor deposition (PECVD), and high-k dielectrics selected from the group consisting of HfO2, ZrO2, TiO2, SiN, and Al2O3.

45. The device of claim 31 further comprising:
an emission conversion layer overlying the electroluminescent layer including a dye selected from the group consisting of a fluorescent and phosphorescent dye.

46. A method for operating an electroluminescent device, the method comprising:
supplying a first voltage to an n+ region of a p+/n+ junction;
supplying a reference voltage to a p+ region of the p+/n+ junction;
injecting holes and electron from the p+/n+ junction into a hot carrier interface of an electroluminescent layer;
recombining the holes and electrons in the hot carrier interface; and,
emitting light from the electroluminescent layer hot carrier interface overlying the p+/n+ junction in the wavelengths between 350 and 700 nanometers (nm).

47. A method for operating an electroluminescent device, the method comprising:
supplying a first voltage to an n+ region of a p+/n+ junction;
supplying a reference voltage to a p+ region of the p+/n+ junction;
injecting holes and electron from the p+/n+ junction into a hot carrier interface of an electroluminescent layer;
recombining the holes and electrons in the hot carrier interface; and,
emitting light from the electroluminescent layer hot carrier interface overlying the p+/n+ junction in the wavelengths between 370 and 390 nanometers (nm).

48. A method for operating an electroluminescent device, the method comprising:
supplying a first voltage to an n+ region of a p+/n+ junction;
supplying a reference voltage to a p+ region of the p+/n+ junction;
injecting holes and electron from the p+/n+ junction into a hot carrier interface of an electroluminescent layer;
recombining the holes and electrons in the hot carrier interface;

emitting light from the electroluminescent layer hot carrier interface overlying the p+/n+ junction;

applying a bias voltage, in the range of 40% to 60% of the first voltage, to an electrode overlying the electroluminescent layer; and, modulating the emitted light in response to the bias voltage.

49. A method for operating an electroluminescent device, the method comprising:

supplying a first voltage to an n+ region of a p+/n+ junction;

supplying a reference voltage to a p+ region of the p+/n+ junction;

injecting holes and electron from the p+/n+ junction into a hot carrier interface of an electroluminescent layer;

recombining the holes and electrons in the hot carrier interface;

emitting light from the electroluminescent layer hot carrier interface overlying the p+/n+ junction;

passing the emitted light through an emission conversion layer, including a dye selected from the group consisting of fluorescent and phosphorescent dyes; and, converting emitted light having a wavelength less than 400 nm, into light having a wavelength of greater than 400 nm.

50. A method for operating an electroluminescent device, the method comprising:

supplying an ac voltage modulated at a first rate of 1 gigahertz (GHz), or less, to an n+ region of a p+/n+ junction;

supplying a reference voltage to a p+ region of the p+/n+ junction;

injecting holes and electron from the p+/n+ junction into a hot carrier interface of an electroluminescent layer;

recombining the holes and electrons in the hot carrier interface; and, emitting light from the electroluminescent layer hot carrier interface overlying the p+/n+ junction at the first rate.

51. A method for operating an electroluminescent device, the method comprising:

simultaneously supplying a first voltage to a plurality of n+ regions;

simultaneously supplying a reference voltage to a plurality of p+ regions interleaved between the n+ regions;

injecting holes and electron from the plurality of p+/n+ junctions into a hot carrier interface of an electroluminescent layer;

recombining the holes and electrons in the hot carrier interface; and, emitting light from the electroluminescent layer hot carrier interface overlying the p+/n+ junctions.

52. The method of claim 51 wherein supplying a first voltage includes supplying a dc voltage level responsive to a gap in the substrate between the interleaved n+ and p+ regions.

53. The method of claim 52 wherein supplying a first dc voltage level responsive to the gap in the substrate between the interleaved n+ and p+ regions includes supplying a voltage of 7 volts in response to a gap of about 0.6 microns.

54. A method for operating an electroluminescent device, the method comprising:

supplying an impulse signal first voltage, with rise times and fall times of less than 10 nanoseconds, to an n+ region of a p+/n+ junction;

supplying a reference voltage to a p+ region of the p+/n+ junction;

injecting holes and electron from the p+/n+ junction into a hot carrier interface of an electroluminescent layer;

recombining the holes and electrons in the hot carrier interface; and, emitting light from the electroluminescent layer hot carrier interface overlying the p+/n+ junction.

* * * * *

UNITED STATES PATENT AND TRADEMARK OFFICE
CERTIFICATE OF CORRECTION

PATENT NO.       : 7,208,768 B2
APPLICATION NO.  : 10/836669
DATED            : April 24, 2007
INVENTOR(S)      : Yoshi Ono et al.

It is certified that error appears in the above-identified patent and that said Letters Patent is hereby corrected as shown below:

Claim 20 has been incorrectly printed. The phrase beginning at line 43 reads, "supplying reference voltage to a p+ region of the p+/n+ junction;" The phrase should read, "supplying the reference voltage to a p+ region of the p+/n+ junction;" Claim 20 in its entirety should read as follows:

20. A method for operating an electroluminescent device, the method comprising:
   supplying a first dc voltage to an n+ region of a p+/n+ junction, at least 3.4 volts greater than a reference voltage;
   supplying the reference voltage to a p+ region of the p+/n+ junction;
   injecting holes and electron from the p+/n+ junction into a hot carrier interface of an electroluminescent layer;
   recombining the holes and electron in the hot carrierinterface; and,
   emitting light from the electroluminescent layer hot carrier interface overlying the p+/n+ junction, where the electroluminescent material is selected from the a consisting of nanocrystalline Si, nanocrystalline Ge, fluorescent polymers, and type II-VI materials selected from the group consisting of ZnO, ZnS, ZnSe, CdSe, and CdS.

Claim 32 has been incorrectly printed. The last term in the claim, on line 55, is printed as "SjC". The term should be "SiC". Claim 32 in its entirety should read as follows:

32. The device of claim 31 wherein the type IV semiconductor material substrate is a material selected from the group consisting of Si, C, Ge, SiGe, and SiC.

Signed and Sealed this

Twenty-sixth Day of June, 2007

JON W. DUDAS
*Director of the United States Patent and Trademark Office*